US006873708B1

(12) United States Patent
Levy

(10) Patent No.: US 6,873,708 B1
(45) Date of Patent: Mar. 29, 2005

(54) METHOD AND APPARATUS TO SIMULATE ROTATIONAL SOUND

(75) Inventor: Kenneth Lee Levy, Stevenson, WA (US)

(73) Assignee: Acoustic Information Processing Lab, LLC, Stevenson, WA (US)

(*) Notice: Subject to any disclaimer, the term of this patent is extended or adjusted under 35 U.S.C. 154(b) by 0 days.

(21) Appl. No.: 09/492,256

(22) Filed: Jan. 27, 2000

Related U.S. Application Data

(60) Provisional application No. 60/117,492, filed on Jan. 27, 1999.

(51) Int. Cl.[7] .................... H03G 5/00

(52) U.S. Cl. .................... 381/98; 84/706

(58) Field of Search .................... 381/98, 102, 340, 381/61; 700/94; 84/608, 705, 706

(56) References Cited

U.S. PATENT DOCUMENTS 3,080,786 A 3/1963 Leslie
3,629,484 A * 12/1971 Suzuki .................... 84/705
3,749,837 A * 7/1973 Doughty .................... 84/1.25
3,943,465 A 3/1976 Uchiyama .................... 372/87
3,973,223 A 8/1976 Uchiyama .................... 332/152
3,973,462 A 8/1976 Uchiyama .................... 84/705
4,000,676 A 1/1977 Love .................... 84/706
4,008,641 A 2/1977 Takada et al.
4,031,795 A 6/1977 Bunger .................... 84/705
4,035,582 A 7/1977 Okamoto .................... 381/62
4,064,778 A * 12/1977 Uchiyama .................... 84/1.25
4,108,041 A 8/1978 Moog et al. .................... 84/706
4,162,372 A 7/1979 Gross
4,308,422 A * 12/1981 Schmoll, III .................... 179/1
4,308,428 A * 12/1981 Finch .................... 179/1
4,370,654 A * 1/1983 Krutsch .................... 343/18
4,428,270 A 1/1984 Ippolito .................... 84/706
5,848,166 A * 12/1998 Fisher et al. .................... 381/62

* cited by examiner

*Primary Examiner*—Duc Nguyen
*Assistant Examiner*—Lun-See Lao

(57) ABSTRACT

Since the prior-art is based upon analog circuitry, it uses sinusoidal frequency and/or amplitude modulation to simulate a rotating speaker at a reasonable cost. This invention uses a process based upon theoretically derived frequency modulation (FM) and experimentally measured amplitude modulation (AM) to simulate the rotating speaker. The main FM equation is based upon the Doppler effect and is equal to one over one plus a sinusoidal velocity coefficient. The main AM equation has a much narrower peak than sinusoidal modulation. This invention also contains several novel methods to control the angular velocity of the speakers, including changing the horn's speed dependent upon the original audio, modeling the speaker's acceleration to allow the physically realistic transitions between angular velocities, and adding noise to simulate natural variations in rotation. The digital apparatus that implements this invented process includes a digital processor and memory. In summary, the invented process is much more realistic sounding than prior-art.

20 Claims, 3 Drawing Sheets

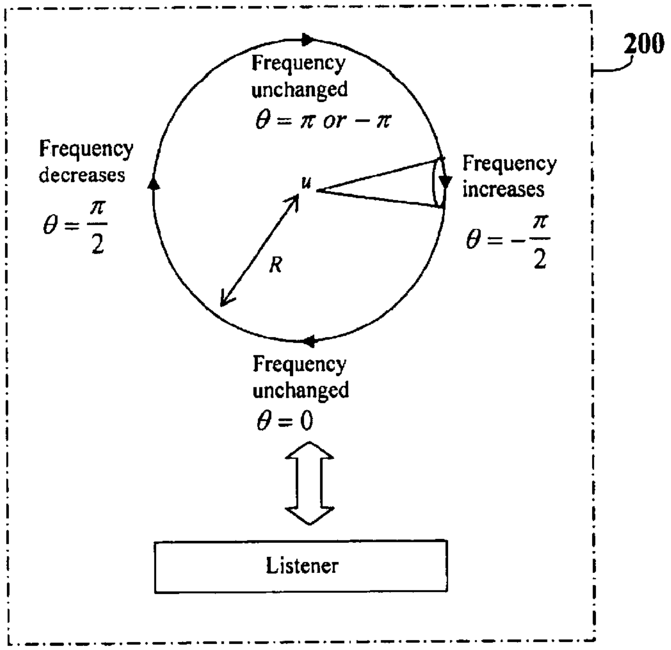
Fig. 2A
210
Doppler Equation
$$f' = \left( \frac{1}{1 + \frac{v_s}{v_{air}}} \right) f$$
Fig. 2B
220
Velocity of Rotating Horn
$$v_s = 2\pi u R \sin(\theta)$$
Fig. 2C
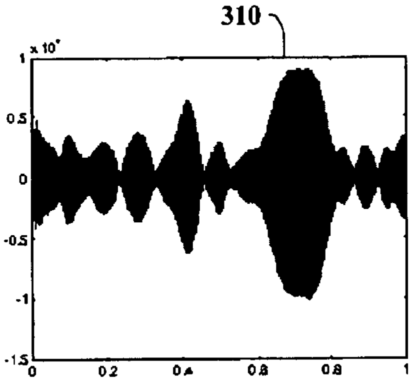
Fig. 3A
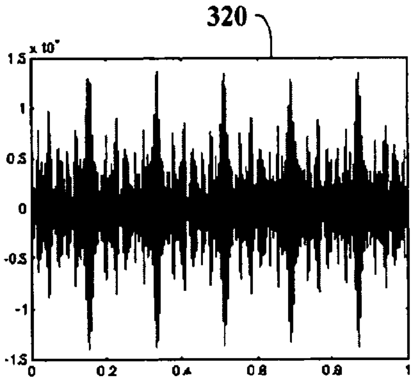
Fig. 3B
330
Simulate Amplitude Modulation
$$z = y * \left( (1 - c_1) + \frac{c_1 c_2}{c_2 + \theta^{c_3}} \right)$$
Fig. 3C

METHOD AND APPARATUS TO SIMULATE ROTATIONAL SOUND

This application claims the benefit of Provisional Patent Applications Ser. No. 60/117,492 filed Jan. 27, 1999, incorporated herein by reference.

BACKGROUND OF THE INVENTION

This invention relates to the field of simulating a rotating speaker or set of speakers, such as a bass speaker and treble speaker, with a digital process and apparatus.

The prior-art is based upon analog methods and apparatus, which require tradeoffs between expense and accuracy. The prior-art methods use sinusoidal frequency modulation based upon triggering an analog or digital delay circuit using a sinusoidal modulator, or phase modulators. The prior-art methods also use the same sinusoidal modulator, although phase shifted, for amplitude modulation. In addition, most prior-art methods do not allow for continuous adjustment of parameters, but only changing between a predetermined slow and fast setting. Finally, the prior-art does not simulate the transition between two settings.

SUMMARY OF THE INVENTION

This invention has two main objectives. First, it simulates frequency modulation (FM) with an equation derived from the theory based upon the Doppler equation. The resulting FM equation is not sinusoidal, but equal to one over one plus a sinusoidal velocity coefficient. Second, this invention uses an amplitude modulation (AM) equation that matches data measured from rotating speakers. The resulting AM equation has a much narrower peak than sinusoidal modulation, and is efficiently simulated with a constant plus a related constant divided by the quantity of another related constant plus a square of the phase. However, AM seems less important than frequency modulation in sound quality, and may be left out.

This invention also contains additional objectives relating to novel methods of controlling the angular velocity of the speaker. One method allows the speaker to change angular velocity dependent upon the original audio's volume level. Another method models the speaker's acceleration, thus allowing the invented process to transition between settings with different angular velocities as would a physical speaker. A further method adds noise to the angular position to simulate natural variations in rotation.

The advantages and novel features of this invention stem from the fact that it is implemented in digital hardware. The digital hardware, including a digital processor and memory, allow complex equations to be simulated, as compared to what can be implemented with analog circuitry. Finally, to keep the horn's synchronized with each other and the buffers, the digitization error of digital hardware is dealt with using fudge factors based upon calculation errors during each revolution of the horn.

BRIEF DESCRIPTION OF THE DRAWINGS

FIGS. 2A, B and C are a diagram showing how the frequency modulation equation was derived.

FIGS. 3A, B and C show graphs of measured amplitude modulation and the resulting efficient equation.

DETAILED DESCRIPTION OF THE INVENTION

The process and apparatus for this invention are based upon a theoretical consideration of the frequency modulation and the measurement of the amplitude modulation of a rotating speaker. The process and apparatus are described below for the case with a separate bass and treble speaker or horn. Please note that the terms speaker and horn are used interchangeably throughout. In addition, the rotating speaker could have only one horn, playing either all or part of the frequency spectrum, or three or more horns, containing bass, midrange and treble frequency bands.

When necessary, variables have subscripts for whether they apply to the bass horn section (LF for low frequency) or the treble horn section (HF for high frequency). This subscript protocol emphasizes that the bass and treble horns can have different parameters, such as rotational frequency. However, in some equations or descriptions, the subscripts are left out for simplicity, and it is either stated how to apply the variable or obvious that the variable or equation can be applied to either horn with the appropriate subscript.

Figure 1:
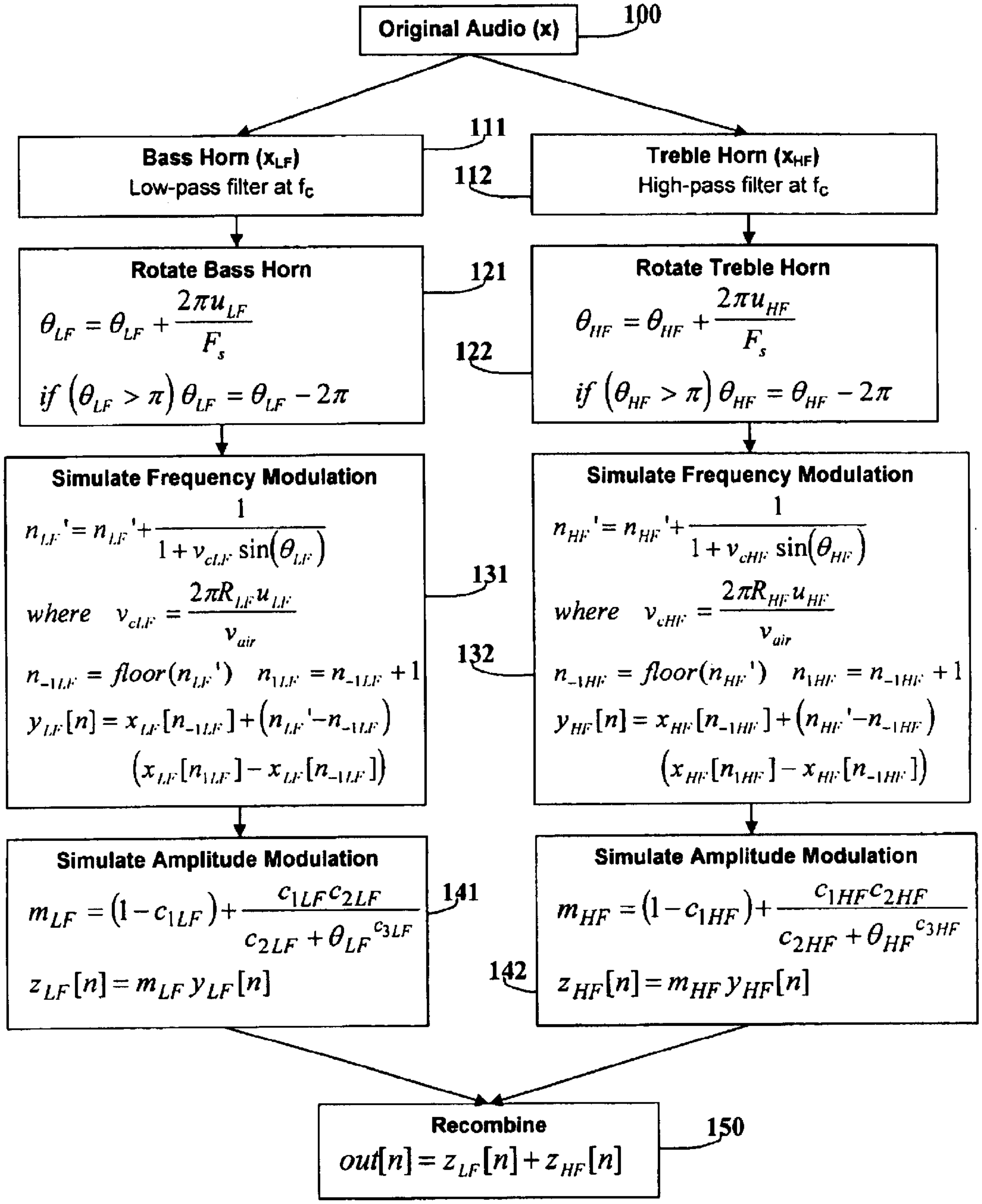
FIG. 1 is the pseudo-code for the process of simulating a rotational sound.

FIG. 1 represents the pseudo-code for the overall process of simulating rotational sound. First, original audio 100, labeled x, is filtered to simulate the speaker's electrical frequency division (a.k.a. crossover) circuit. The low-pass filtered data is used in simulating the bass horn, as shown in box 111 and labeled $x_{LF}$, and the high-passed filtered data is used in simulating the treble horn, as shown in box 112and labeled $x_{HF}$. The cutoff frequency, $f_c$, is usually between 100 and 1000 Hz, preferably around 500 Hz. A Butterworth filter of order 4 is also preferred, and the equations are well known in the state of the art of digital signal processing.

Second, the simulation of the rotation of the bass and treble horns are shown in boxes 121 and 122, respectively. These horns are usually rotating at different velocities. In these equations, u represents angular velocity in cycles per second (cps), and θ represents the amount of rotation in radians. These equations represent the following facts. For each data sample the horn rotates by 2 pi multiplied by its angular velocity and time, where time is equal to one over the sampling rate ($F_s$). The range of θ is between −pi and pi (where two pi represents a complete circle in accordance with the standard definition—see FIG. 2A and the explanation below). Thus, when the angle is greater than pi, subtracting 2 pi gives the corresponding angle in the range of −pi and pi.

The rotating speaker historically has the horns rotate in opposite direction. This can be simulated by adding the change in phase to one horn, i.e. spinning in the positive direction, and subtracting the change in phase to the other horn, i.e. spinning in the negative direction. The phase reset equation for the horn spinning in the negative direction must be modified correspondingly, such as adding 2 pi when the phase is below −pi. The horn spinning in the positive direction uses the same phase equations as given in boxes 121 and 122. However, unless you are modeling a 3D effect, such as the speaker cabinet, room or microphones, the direction of rotation does not matter. This indifference occurs since the frequency and amplitude modulation change symmetrically no matter which way the horn rotates.

For example, assuming the rotation begins with the horn in the front of the speaker, the amplitude and frequency modulations both decreases and then increase, no matter which way the speaker spins. Alternatively, when modeling microphones, the direction can be simulated by defining positive phase oppositely for each horn, thus still using the equations 121 and 122. In addition, if ignoring 3D effects, only the phase difference between the microphones needs to be modeled, and one microphone can be considered phase 0. This is more efficient as well as making it easier to switch the horns from similar to opposite rotation. For example, with two microphones horizontally separated, the treble horn will hit mic1 first and then mic2, whereas the bass horn will hit mic2 first and then mic1, and all that matters is relative, not absolute, positions and times.

Four or more microphones may also be modeled, with some behind the speaker to give surround sound. Alternatively, the program could be run several time, in parallel, using the same input audio and two microphones in different positions for each instance, and the resulting audio can be recombined to give surround sound—assuming the microphones are modeled both behind and in front of the speaker. For these surround sound cases, it may sound better to rotate the speakers in the same direction, too.

Third, the frequency modulation is simulated based upon applying the Doppler equation to a rotating speaker and a stationary listener, as shown in FIGS. 2A, B and C. Drawing 200 displays the parameters for a rotating speaker. The angular velocity is u and has units of cycles per second (cps), the radius is R and has units of inches, and the current angle is θ and has units of radians. The current angle is defined such that 0 is straight forward, pi/2 is to the left, pi or −pi is straight back and −pi/2 is to the right. This gives a full circle of two pi radians in accordance with the standard definition, and works with the amplitude modulation equations presented below. The Doppler equation is displayed in box 210, where a positive source velocity ($v_s$) is for a source moving away from a stationary observer, and the velocity of sound in air is represented by $v_{air}$, preferably around 13,495 inches per second. The equation for the source velocity ($v_s$) for a rotating horn is shown in box 220. The source velocity represents the component of the angular velocity in the direction of the listener, ignoring size differences between the listener and the speaker. Given these two equations, one can see that the frequency decreases as the horn moves away from the listener, is unchanged when the horn moves parallel to the listener, and increases as the horn moves towards the listener, as shown in drawing 200. Most importantly, this frequency change is not sinusoidal, but related to one over one plus a sinusoidal velocity component.

The digital process, as shown in boxes 131 and 132 of FIG. 1, cannot implement the Doppler equation directly, but uses digital re-sampling to simulate the equation. Note that the FM output is represented by variable y. The preferred re-sampling method is based upon linear interpolation due to its efficiency, but other methods, such as convolution with a sinc function can be used to balance accuracy and efficiency—all well known in the digital signal processing. Specifically, n represents the sample location in the output data, while n' represents the desired sample location in the input data. Since, when n' is not an integer the data sample does not exist, linear interpolation is used to estimate its value where $n_{-1}$ represents the integer immediately before n', and $n_1$ represents the integer immediately after n'. The relationship between n', the sample location in the input data, and f', the new frequency due to the Doppler effect, is best explained by the following example. When the frequency increases, the output samples are taken further apart than one sample in the input data, thus, n' is incremented by an amount greater than one. The opposite happens when the frequency decreases. In other words, n' and f' are directly, not inversely, related.

Fourth, the amplitude modulation (AM) is derived from experimental measurements, as shown in FIGS. 3A and B. The measurement involves applying a 5 kHz sine wave and measuring the output of a rotating bass and treble speaker about 5 feet in front of the speaker and 4 feet high. Note that a high frequency sine wave was used to eliminate effects of the bass speaker. The measurement at slow speed, about 0.6 cps, is shown in graph 310, and the measurement at fast speed, about 6 cps, is shown in graph 320. The most important aspect of these graphs is that the modulation is not sinusoidal, but very peaky when the speaker is facing you. The numerous small peaks are ignored in this approximation and are probably due to cabinet and room reverberation. An efficient equation that simulates this modulation is shown in box 330 of FIG. 3C. There are many other equations that can simulate the data, such as using the cosine function rather than the power function for the rotation angle theta. In addition, if using this cosine function, the angle can be pre-warped to increase the sharpness of the peak. However, the power function is more efficient.

The digital implementation of the AM equation for each horn is shown in boxes 141 and 142 of FIG. 1. The AM output is represented by variable z. Coefficient 1, $c_1$, sets the amount of amplitude modulation. Coefficient 2, $c_2$, sets the width of the modulation peak; thus $c_2$ is inversely related to sharpness. Coefficient 3, $c_3$, also sets the shape of the peak. If this coefficient is odd, the absolute value of the angle must be used. The preferred coefficient values are $c_{1LF}$=0.3, $c_{2LF}$=0.5, and $c_{3LF}$=2 for the bass horn and $c_{1HF}$=0.3, $c_{2HF}$=0.2, and $c_{3HF}$=2 for the treble horn. Therefore, the sharpness for the treble horn is greater than for the bass horn, as determined by experiment. Optimally, the signal could be broken into is frequency components, possibly using the fast Fourier transform, and each component can use its own sharpness value, $c_2$. This provides the most realistic sound, but is too computationally complex for current hardware.

Importantly, these values can be set by the user, especially $c_1$, which can be used to represent a ventilation cover for the rotating speaker. Such a cover was often removed or modified by users of physically rotating speakers; thus, it is desirable to have it as a user defined variable. In addition, coefficient 1, $c_1$, can be made dependent upon the angular velocity. This can occur by including the angular velocity, u, in an equation for coefficient 1. The modulation term, m, in boxes 141 or 142 may also be low-passed, band-passed, or high-passed filtered to create the desired dependency upon angular velocity.

Another modification of the given AM equation is to include a smaller term that peaks when the speaker is towards the wall. This peak is due to the direct reflection from the wall. Similar equations can be used with the rotation angle, θ, shifted by pi.

Finally, listening tests provide some evidence that AM is less important than frequency modulation in the resulting sound quality, and this step may be skipped, which is equivalent to setting coefficient 1 equal to 0.

Fifth, the simulated bass and treble horn signals are recombined in box 150. A scaling coefficient around 0.8 may be required to maintain the same perceived loudness at the output as the input. The filters may also be shaped or spaced to produce a non-flat equalization to resemble that of a physical rotating speaker. The final output is represented by the variable out.

Historically, the speaker has the treble horn on the top and bass horn on the bottom. This only matters if 3D effects, such as the cabinet, room or microphone placement, are modeled. When modeling microphone placement, as you move the microphone up, the amount of treble will increase, and, as you move the microphone down, the amount of bass will increase. This effect is simulated by multiplying the result, z, from each horn, with a constant when the horn data is recombined in equation 150. The constant is inversely related to the distance from the microphone to the horn divided by the distance between the horns. Therefore, a larger constant means the microphone is closer to that horn. The above description has assumed that the angular velocity is given. However, it is important that the angular velocity is modifiable by the user of the apparatus. The simplest method is for the user to manually change the angular velocity in the user interface of the apparatus. However, this invention presents several novel methods and the corresponding digital apparatus to implement changes in the angular velocity of the speaker.

Figure 4A:
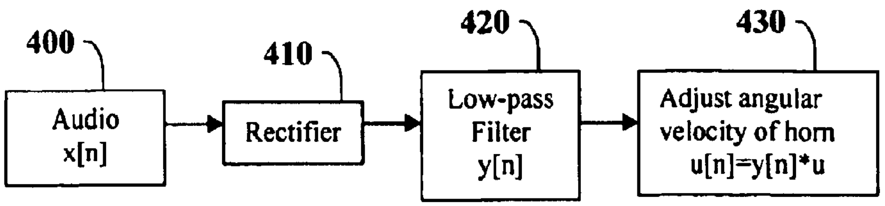
FIG. 4*a* is the pseudo-code for the auto-speed control.

The novel auto-speed approach is shown in FIG. 4*a*. In this approach the horn's angular velocity is dependent upon the intensity (a.k.a. volume) of the audio. The process is as follows. Input audio 100, x, is first rectified (box 410), then low pass filtered (box 420) resulting in data y. Finally, the data y, which represents the audio's intensity is used to adjust the velocity, u, as shown in box 430. The resulting velocities will be used in boxes 121 and 122 of FIG. 1. It is desirable that y is between 0 and 1, thus allowing the velocity to go between 0 and u. If not, y should be scaled by its full scale value or any other constant. The input audio 400 may represent the original input audio as shown in box 100 of FIG. 1. However, the horn's angular velocity can be changed for each horn independently, in which case the input audio 400 would represent the output of the respective bass and treble horn filters, as shown in boxes 111 and 112 of FIG. 1, or any derivation of such signals. This auto-speed feature can produce awesome flanging of the audio.

Figure 4B:
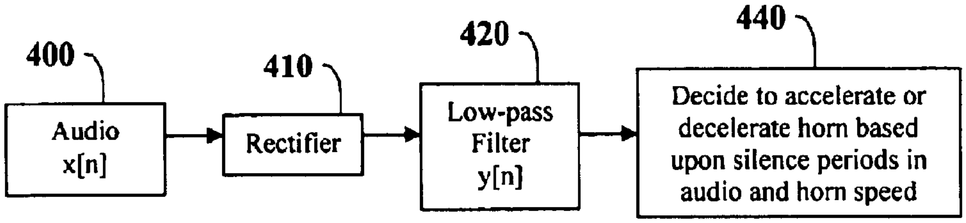
FIG. 4*b* is the pseudo-code for the auto-rhythm control.

The novel auto-rhythm approach is shown in FIG. 4*b*. When using a rotating speaker, the organ player has a foot pedal to switch the speaker between a slow or off speed to a fast speed. The switch is based upon the rhythm of the music. The auto-rhythm approach automatically determines when to switch the horn. The process is similar to the auto-speed approach. Input audio 400, x, is first rectified (box 410), then low pass filtered (box 420) resulting in data y. The resulting data y, which represents the audio intensity (or volume), is used to determine when to accelerate and decelerate the horn based upon silent gaps and the horn's speed. Specifically, each horn will accelerate from one speed, such as a slow 0.2 cps, to the value of another speed, such as a fast 6 cps, when the audio volume increases from near zero loudness, such as 2% of full scale. Then, the horns will decelerate once either horn reaches near, such as 90% of, full speed. The acceleration begins again at the next increase in loudness, only if the horns have slowed down, such as to below 50% of maximum speed. This example shows both horns working synchronously, as happens in the physical speaker, however, the algorithm can easily be adapted for each horn to work independently of the other. Finally, the resulting angular velocity should be modeled using the equation 500 of FIG. 5, as described next, and used in equations 121 and 122 of FIG. 1.

Figure 5:
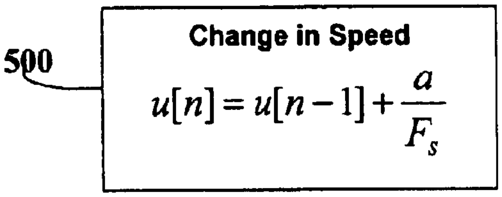
FIG. 5 is the equation for modeling the speaker's acceleration.

Another novel approach is to allow the user to switch between velocity settings, such as a slow and fast setting, and simulate the acceleration of each horn when changing its speed, as shown in FIG. 5. The resulting equation is shown in box 500, and is the digital representation of angular acceleration. Equation 500 would usually be independently applied to each horn, where the bass horn typically accelerates slower than the treble horn. The acceleration range is between 0.1 to 10 cps per second, and user modifiable. Once again, the resulting velocities will be used in boxes 121 and 122 of FIG. 1.

Figure 6:
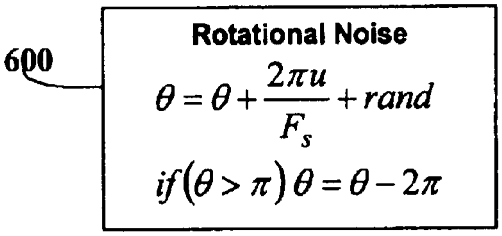
FIG. 6 is the equation for modeling rotational noise.

The last novel approach to improving the sound quality with an improved model of angular velocity is shown in FIG. 6. The process adds noise, labeled rand, to the position of the speaker, as shown in box 600. A standard deviation of rand is around 0.15 of the change in the rotation angle, θ, for each time step. Therefore, the random number is dependent upon the speed, and if using a uniform distribution between 0 and 1, its maximum value is approximately ½ the change in rotation for each time step. The equations in box 600 can replace those found in boxes 121 and/or 122 of FIG. 1. The perfect calculation performed by the digital apparatus without this noise does not sound as good as the natural variations found in an actual rotating speaker. Alternatively, this method could affect the speaker's velocity or affect the calculation of position in the input (n') rather than the horn's position.

Figure 7:
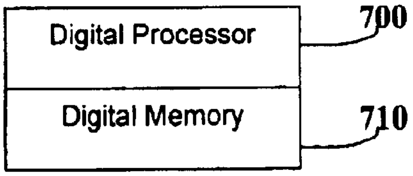
FIG. 7 is the digital apparatus required to implement the novel process.

The apparatus that implements this invented process is shown in FIG. 7. A digital processor 700 could be a host CPU, such as the Intel Pentium™ chip, or a special digital signal processor, such as a Texas Instruments TMS320™. The program, such as machine- or c-code, for these processors can easily be written from the pseudo-code and equations described above by someone familiar with the state of the art of digital signal processing. The program logic, program data and audio will be stored in digital memory 710. The memory may consist of random access memory (RAM) and/or a magnetic or optical disk.

The program machine- or c-code used to control the apparatus is a little more difficult than for many standard implementations. As usual, the data is delivered in a buffer whose size depends upon the desired user delay, and the last data point in the input buffer needs to be saved between buffers to perform the linear interpolation. In addition, the output buffer is the same size as the input buffer, thus allowing real-time synchronization between input and output data. Different size output buffers can be used for some embodiments, which makes the implementation easier, but it is desirable to have the input and output buffers be of equal size.

However, since the frequency is changing due to the rotation, one point in the input buffer does not necessarily produce one point in output buffer. This means the program needs to add some zeros to the first output buffer, producing a slight delay, and then save the extra input data when the output data buffer is full. This extra input data is included with the next input buffer. This delay keeps the output buffer full when the input buffer occurs during the section of rotation where the horn spins towards the listener, and input points are used faster than output points are produced. Using 440 points, a 10 ms delay with a 44100 Hz sampling frequency, works well.

In addition, one horn may have finished processing the input buffer while the other horn has not. The remaining data must be dealt with, either saved for the next buffer, or processed, saved and used in the next buffer.

Finally, digitization errors in the rotation calculation can add up over time, causing the horns to become unsynchronized with each other or the data. The horns are considered unsynchronized with each other when they are more than one buffer away from each other in time. A horn is considered unsynchronized with the data when it has used up the initial delay. These two problems are solved by making sure the amount steps are shorter than 1 equals the amount steps are longer than 1 during a complete rotation of 2 pi, as should happen without digitization error. If the short and long steps are not balanced, a fudge factor is produced and it is subtracted from each step during the following complete rotation to keep the horn's synchronized. Specifically, if you sum the step size minus one over a complete rotation of 2 pi, it should sum to 0. If it does not, you can subtract this sum divided by the number of steps expected in the next complete rotation, from each rotation step. The expected number of steps is 2 pi divided by the change in theta for each step. Obviously, this calculation affects and is affected by horn acceleration, since the sum will not be zero for an accelerating horn. However, it is necessary to keep the horns synchronized with the buffer. Importantly, it will all equal out over time since sometimes the acceleration will cause fewer points per rotation sometimes and other times it will produce more points per rotation, depending upon whether the horn is accelerating or decelerating. Finally, this method is equivalent to than keeping track of the number of steps in each rotation and comparing it to the desired number of steps as determined by the angular velocity.

The foregoing descriptions of the preferred embodiments of the invention have been presented to teach those skilled in the art of signal processing how to best utilize the invention. Many modifications and variations are possible in light of the above teaching, such as similar equations to model the frequency and amplitude modulation involved in a rotational sound. In addition, more than two horns or a single horn may be simulated given the above description. To this end, the following claims define the scope and spirit of the invention.

What is claimed is:

1. A process to electronically simulate a sound of a rotating speaker comprising: receiving an input audio signal, and electronically applying frequency modulation to said input audio signal with a frequency modulation function to produce an output audio signal, wherein said frequency modulation function electronically approximates an inverse of a sum of one plus a quantity, said quantity approximates a periodic function multiplied by a constant, and said periodic function is related to a period of said rotating speaker.

2. The process of claim 1 further comprising: performing the simulation digitally, wherein said input audio signal has input audio samples and said output audio signal has output audio samples; re-sampling said input audio samples with varying step size, wherein said varying step size is related to said frequency modulation function, and said periodic function is sinusoidal; and using interpolation between said input audio samples to produce said output audio samples.

3. The process of claim 2 wherein said rotating speaker has a phase of rotation, said periodic function is a sinusoidal function of said phase of rotation, said interpolation is linear, said constant is related to the speed of sound in air, and said input audio signals and said output audio signals have a sample step of equal size.

4. The process of claim 1 further comprising: applying amplitude modulation, in addition to said frequency modulation, wherein said amplitude modulation produces at least one amplitude envelope peak that is sharper than a sinusoidal amplitude envelope with the sinusoid having a similar period as said period of said rotating speaker.

5. The process of claim 2 further comprising: applying amplitude modulation to said output audio samples, and producing final audio samples, wherein said amplitude modulation produces at least one major amplitude envelope peak in said final audio samples that is sharper than a sinusoidal amplitude envelope with the sinusoid having a similar period as said period of said rotating speaker.

6. The process of claim 5 further comprising: accounting for digitization errors by approximating a sum of each difference between one and the varying step sizes during one or more previously completed rotations, and if the sum is not approximately zero, removing the digitization errors with a fudge factor which modifies said varying step size for a number of samples in one or more upcoming rotations, wherein said fudge factor is related to the number of samples modified and the sum.

7. The process of claim 3 further comprising: applying amplitude modulation to said output audio samples, and producing final audio samples, wherein said amplitude modulation produces at least one major amplitude envelope peak in said final audio samples that is sharper than a sinusoidal amplitude envelope with the sinusoid having a similar period as said period of said rotating speaker, said amplitude modulation is produced by an amplitude modulation function that is based upon one or more constants and said phase of rotation raised to the power of one of the constants.

8. The process of claim 5 wherein said rotating speaker has an angular velocity, further comprising: automatically varying said angular velocity based upon said input audio samples.

9. The process of claim 8 further comprising: changing said angular velocity based upon a model of acceleration for said rotating speaker, silent gaps in said input audio samples, and the angular velocity's current value.

10. The process of claim 5 wherein said rotating speaker has a phase of rotation, further comprising: adding noise to said phase of rotation for several of the varying step sizes.

11. The process of claim 2 further comprising: simulating both a bass and treble rotating speaker, calculating a digital crossover filter to produce input bass and treble samples from original audio samples, representing said bass and treble samples as independent input audio samples and performing said frequency modulation independently and with different parameters on the input bass and treble samples to produce output bass and treble samples, and adding at least part of the output bass and treble samples to produce final audio samples.

12. The process of claim 5 further comprising: simulating both a bass and treble rotating speaker, calculating a digital crossover filter to produce input bass and treble samples from original audio samples, representing said bass and treble samples as independent input audio samples and performing said frequency modulation independently and with different parameters on the input bass and treble samples to produce output bass and treble samples, performing said amplitude modulation independently and with different parameters on the output bass and treble samples to produce final bass and treble samples, and adding at least part of the final bass and treble samples to produce final audio samples.

13. A digital apparatus to digitally simulate the sound of a rotating speaker comprising: a digital processor and digital memory, wherein said digital memory includes codes stored thereon for execution by said digital processor, wherein the codes apply frequency modulation to input audio samples with a frequency modulation function to produce output audio samples, said frequency modulation function approximates an inverse of a sum of one and a quantity, said quantity approximates a periodic function multiplied by a constant, and said periodic function is related to a period of said rotating speaker.

14. The apparatus of claim 13 wherein said codes calculate amplitude modulation, in addition to said frequency modulation, wherein said amplitude modulation produces at least one amplitude envelope peak that is sharper than a sinusoidal amplitude envelope with the sinusoid having a similar period as said period of said rotating speaker.

15. The apparatus of claim 11 wherein said codes simulate both a bass and treble rotating speaker, said codes calculate a digital crossover filter to produce input bass and treble samples from original audio samples, said codes represent said bass and treble samples as independent input audio samples and perform said frequency modulation independently and with different parameters on the input bass and treble samples to produce output bass and treble samples, and said codes add at least part of the output bass and treble samples to produce final audio samples.

16. The apparatus of claim 13 wherein said codes re-sample said input samples at a varying step size, wherein said varying step size is related to said frequency modulation function and said periodic function is sinusoidal, and said codes use interpolation between input audio samples to produce said output audio samples.

17. The apparatus of claim 16 wherein said codes additionally apply amplitude modulation to said output audio samples, and produce final audio samples, wherein said amplitude modulation produces at least one major amplitude envelope peak in said final audio samples that is sharper than a sinusoidal amplitude envelope with the sinusoid having a similar period as said period of said rotating speaker.

18. The apparatus of claim 17 wherein said codes simulate both a bass and treble rotating speaker, said codes calculate a digital crossover filter to produce input bass and treble samples from original audio samples, said codes represent said bass and treble samples as independent input audio samples and perform said frequency modulation independently and with different parameters on the input bass and treble samples to produce output bass and treble samples, perform said amplitude modulation independently and with different parameters on the output bass and treble samples to produce final bass and treble samples and said codes add at least part of the final bass and treble samples to produce final audio samples.

19. The apparatus of claim 17 wherein said codes account for digitization error of digital hardware by approximating a sum of each difference between one and said varying step size during one or more previously completed rotations, and if the sum is not approximately zero, removing the digitization errors with a fudge factor which modifies a number of the varying step sizes in one or more upcoming rotations, wherein said fudge factor is related to the number of the varying step sizes and the sum.

20. The apparatus of claim 17 wherein said rotating speaker has an angular velocity, and said codes implement automatic variation of said angular velocity based upon the input audio samples.

* * * * *

UNITED STATES PATENT AND TRADEMARK OFFICE

CERTIFICATE OF CORRECTION

PATENT NO. : 6,873,708 B1   Page 1 of 1
DATED : May 19, 2005
INVENTOR(S) : Kenneth Lee Levy It is certified that error appears in the above-identified patent and that said Letters Patent is hereby corrected as shown below:

Column 9,
Line 12, change "claim 11" to -- claim 16 --

Signed and Sealed this

Twenty-sixth Day of July, 2005

JON W. DUDAS
*Director of the United States Patent and Trademark Office*